United States Patent
Miller

(10) Patent No.: US 6,952,173 B2
(45) Date of Patent: Oct. 4, 2005

(54) MINIATURIZED 4-KEY COMPUTER KEYBOARD OPERATED BY ONE HAND

(76) Inventor: Martin Miller, 24 Cougarstone Cove SW, Calgary, Alberta (CA), T3H 4W7

( * ) Notice: Subject to any disclaimer, the term of this patent is extended or adjusted under 35 U.S.C. 154(b) by 719 days.

(21) Appl. No.: 10/107,069

(22) Filed: Mar. 28, 2002

(65) Prior Publication Data

US 2002/0175834 A1 Nov. 28, 2002

Related U.S. Application Data

(60) Provisional application No. 60/280,988, filed on Apr. 4, 2001.

(51) Int. Cl.[7] .................. H03K 17/94; H03M 11/00
(52) U.S. Cl. .................. 341/22; 341/26; 400/489; 708/146
(58) Field of Search .................. 341/22, 26; 345/168, 345/172; 400/485, 489; 708/142, 146; 710/67

(56) References Cited

U.S. PATENT DOCUMENTS

| | | | | |
|---|---|---|---|---|
| 4,490,056 A | * | 12/1984 | Whitaker .................. 400/100 |
| 4,791,408 A | * | 12/1988 | Heusinkveld .................. 700/84 |
| 4,849,732 A | * | 7/1989 | Dolenc .................. 341/20 |
| 4,913,573 A | * | 4/1990 | Retter .................. 400/489 |
| 5,087,910 A | * | 2/1992 | Guyot-Sionnest .................. 345/169 |
| 5,281,966 A | * | 1/1994 | Walsh .................. 341/22 |
| 5,627,566 A | * | 5/1997 | Litschel .................. 345/168 |
| 6,429,854 B1 | * | 8/2002 | McKown .................. 345/168 |

* cited by examiner

*Primary Examiner*—Timothy Edwards, Jr.

(57) ABSTRACT

A miniaturized single-hand keyboard for computers, PDAs, cellular phones and other portable electronic devices. The keyboard has only four keys, each operated by one finger. Characters are generated by depressing a single key or a combination of two keys in a 'composite keystroke'. A composite keystroke is performed by depressing a combination of two keys in a predefined order and then releasing them in a predefined order. In the normal mode, three simple keystrokes and 24 possible composite keystrokes are used to generate each of the 26 alphabetic characters and a space. One of the four simple keystrokes (optionally followed by another simple keystroke) is used to enter one of five other modes (Shift, Numeric, Language, Alternate and Control), which support generating uppercase, numeric, language specific and special characters and cursor control and editing control codes.

6 Claims, No Drawings

MINIATURIZED 4-KEY COMPUTER KEYBOARD OPERATED BY ONE HAND

CROSS-REFERENCE TO RELATED APPLICATIONS

U.S. Provisional application No. 60/280,988 filing date: Apr. 4, 2001

BACKGROUND OF THE INVENTION

1. Field of the Invention

This invention relates to a method and apparatus for providing alphanumeric input to computers and other electronic devices by means of operating four keys (or other four sensors) by four fingers of one hand. The device can be extremely portable and easily operated by one hand, especially since the thumb is not used for operating the keys.

The major fields of use for this invention include:

As a fully functional alphanumeric keyboard for portable computers, Personal Digital Assistants (PDAs), cellular phones, pagers and any other portable electronic devices. Since the invention requires only four buttons/keys to operate, it can easily be incorporated in even the smallest devices.

The four keys required by the invention can be replaced with four sensors attached to the four fingers by rings or otherwise (or even implanted . . . ). The sensors would detect small movements of each finger, change of tension in the muscles or even the bio-electrical signals of the nerves controlling each finger. The movements (or the 'intentions' to move) of the four fingers would then be decoded the same way as for the four key keyboard.

As an input device for desktop computers or any other 'stationary' electronic devices—as a replacement or in addition to the conventional keyboard. The biggest advantage of using a one-hand keyboard being the freedom of the other hand for other chores.

The invention can also be combined with other input devices, like the mouse: a device with the standard mouse buttons and the four buttons/keys required by this invention would provide total mouse pointer control combined with full alphanumeric input—and still be operated just by one hand.

As a fully functional alphanumeric keyboard for handicapped people who can only use one hand.

2. Description of the Prior Art

A number of attempts to design a keyboard operated by one hand have been described in the prior art. These include inventions covered by the following U.S. patents: U.S. Pat. Nos. 4,042,777; 4,344,069; 4,360,892; 4,381,502; 4,555,193; 4,836,700; 4,988,997; 5,288,158.

The problems with these keyboard designs can be divided into two major groups, at least one of them is significant for each of the above inventions:

Too many keys—usually an array of at least 3 by 4 keys, movements of fingers from key to key as well as the chord combinations for all the characters have to be memorized. The number of keys also makes the keyboards too large for truly portable devices.

The keyboards use chords, which for a significant portion of even the basic alphabet characters require pressing three or four fingers/digits (up-to all five digits of one hand), making them very hard to remember and use.

Also, the thumb is used to operate at least one key, making it hard to comfortably hold/operate a portable device that incorporates the keyboard.

BRIEF SUMMARY OF THE INVENTION

The invention describes a method and a device for providing alphanumeric input to electronic devices by means of operating four keys by four fingers of one hand. Each finger stays on its own key and never has to move to any other key. Rather than using chords, described in some previous attempts for a one-hand keyboard, the invention uses what we call 'composite keystrokes'.

A composite keystroke is performed by pressing and releasing a combination of two keys in such way that the second key is pressed before the first one is released and where the order of both pressing and releasing of the two keys is significant. Although it may first seem that the composite keystrokes are complicated, once they are understood they are actually very easy to remember and use. Each composite keystroke is achieved by a single motion of the hand: in either a 'rolling' motion of the hand from one finger to the next, releasing the two keys in the same order they were pressed, or in a 'rocking' motion, from one finger to the other and back, releasing the keys in the reverse order.

The biggest advantage of the invention is that the composite keystroke can be remembered and used as just one keystroke, even though each involves two keys. All the 26 characters of the English alphabet and a space can be generated by the 24 possible composite keystrokes plus three simple keystrokes, without any need to switch to a different mode. Five special modes are provided by the keyboard for entering capital, numeric, language specific and special characters and to generate control codes for editing and cursor movement.

BRIEF DESCRIPTION OF THE SEVERAL VIEWS OF THE DRAWING

Not Applicable

DETAILED DESCRIPTION OF THE INVENTION

The invention describes a method and a device for providing alphanumeric input to electronic devices by means of operating four keys or four sensors by four fingers of one hand.

Although any kind of four sensors capable of distinguishing between the two states—depressed/released (or on/off) could be used, we will assume for the rest of this description that the device is in a form of a miniature keyboard with four keys, numbered from left to right key 1, key 2, key 3 and key 4 and operated by the index, middle, ring and little finger, respectively (the keys are numbered from right to left on a left-handed keyboard).

If the four keys are physically symmetrical, the keyboard can be switched from right-handed to left-handed by means of software or firmware. In case the keyboard is shaped such that it is not symmetrical, perhaps to allow greater comfort for the shorter little finger, a separate right-handed and left-handed version can be made.

Since the keyboard has only four keys, only four characters/codes can be generated by a simple or single keystroke. The key1 single stroke generates a space, the next two keys are used for the two vowels: 'a' and 'e'. Key 4 single stroke is used to enter other modes (see section Operating Modes).

All the other characters are generated by pressing two keys.

Rather than using the term 'chord' as was done in some of the previous attempts in the Prior Art to design a one-hand keyboard, the term 'composite keystroke' is used to indicate the fact that more than one key is involved, but also that the precise order of pressing and releasing the keys is significant.

Composite Keystrokes

A composite keystroke is detected when two keys are pressed such that the second key is pressed before the first key is released. The order in which the two keys are pressed is significant as well as the order in which the keys are released. With the four keys, there is a total of twenty four (24) possible composite keystrokes. They can be divided into two categories: keystrokes where the key that is first pressed is also the first to be released, we can call them FIFO (first-in-first-out), and keystrokes where the key that is pressed the second is the first to be released, we can call them LIFO (last-in-first-out). The FIFO strokes can also be called 'rolling keystrokes', since they suggest a rolling movement of the hand from one finger to another. The LIFO strokes can be called 'rocking keystrokes', since they suggest a rocking motion from one finger to the other and then back.

For example the following sequence:

key3 pressed
key2 pressed
key3 released
key2 released will in the normal mode generate the character 't' and represents a FIFO or rolling composite keystroke.

The sequence:

key1 pressed
key4 pressed
key4 released
key1 released will in the normal mode generate the character 'j' and represents a LIFO or rocking composite keystroke.

The biggest advantage of the composite keystrokes is that once they are understood and after they are tried just a few times, they can be treated as just one keystroke, even if they consist of pressing and releasing two keys. This makes the composite keystrokes much easier to learn than the 'chords' suggested by earlier attempts to create a single-handed keyboard.

Even though the composite keystrokes may feel a little awkward when they are tried for the first time, after some practice they become associated with the single rolling or rocking movement of the two fingers involved and become quite easy to remember and use.

The Cancel Keystroke

When a third key is pressed before any one of the first two keys pressed is released, that is called a 'cancel' keystroke, which implies that no action is taken until after all the keys pressed are released and no character/code is generated. The cancel stroke can be used to correct a mistake that the operator notices before the first of the two pressed keys is released: just press another (third) key and then release all the depressed keys.

The cancel stroke can also be used to quickly return to the normal mode from any other mode (see section Operating Modes).

Operating Modes

The invention can operate in a number of modes. These include the 'normal' mode, control mode, shift mode, numeric mode, language mode and alternate mode. Most of the modes can be combined or nested.

Besides the predefined modes, the invention includes provisions for one or more custom modes.

Normal Mode

In the 'normal' mode, single strokes of the first three keys generate space and characters 'a' and 'e', respectively. All the composite strokes generate the rest of the 26 alphabetic characters (refer to section Character Map for details).

Control Mode

A simple keystroke of the fourth key enters the 'control' mode, which allows generating one of a number of special characters, as well as entering other modes. The control mode lasts only for one keystroke (simple or composite). In other words, in the control mode the next keystroke enters a different mode or one character/code is generated and the device returns to the previous mode. The control mode can be entered from any other mode except for the Alternate mode, by pressing key 4.

A simple stroke of key 1, key 2, key 3 or key 4 while in the control mode enters the Shift, Numeric, Language or Alternate mode, respectively.

Rolling keystrokes in control mode are generally used for cursor control and editing control codes. Rocking keystrokes generate most punctuation mark characters.

Shift Mode

The shift mode works exactly like the normal mode, except that—as expected—all generated characters are uppercase.

The shift mode is entered from the control mode by pressing key 1.

If any character or code except for a space is generated in the shift mode, the mode automatically returns to the previous mode. However, if a second simple key 1 stroke immediately follows the key 1 stroke that entered the shift mode, then the shift mode is locked, and all the following characters are generated in uppercase until the 'cancel keystroke' (see section The Cancel Keystroke) is detected.

Numeric Mode

The numeric mode, as the name suggests, is used to generate numeric characters. It is entered by pressing key 2 in the control mode.

Most of the rolling keystrokes generate the ten digits, the rocking keystrokes are used to generate the signs for numerical operations and other special characters. Some punctuation mark characters (like '.', ',') are duplicated from the control mode to allow easy entry of numeric information.

The numeric mode normally lasts only for one generated character, however, pressing key 2 right after the mode is entered locks the numeric mode and it stays in effect until the Cancel keystroke or until another mode is entered.

Language Mode

Characters generated in this mode are language specific (like ç, è, ï, ñ, š, etc.). The language mode is entered by pressing key 3 in the control mode and it can be combined with shift mode to generate uppercase language specific characters. This mode lasts only for one character, then the mode returns to the previous mode (NOTE: the mode could be made lockable if a need for it is identified). Devices utilizing this invention can support a number of predefined languages and/or support addition of software definable languages.

Alternate Mode

The alternate mode is entered by pressing key 4 in the control mode.

For the rolling keystrokes it works like a locked control mode—it provides the same cursor control and editing control codes without automatic return to the previous mode. The rocking keystrokes in the alt mode provide another set of special characters and return to the previous mode.

The simple keystrokes make the alternate mode different: they are used to control the cursor movement. Simple keystrokes of key 1, key 2, key 3 and key 4 move the cursor up, left, right and down, respectively.

The control mode (normally entered by pressing key 4) is not directly accessible. To leave the alternate mode, the operator can use the cancel keystroke (returning to the normal mode), enter one of the special characters using a rocking keystroke or applying a special keystroke to return to the previous mode.

A number of the rocking keystrokes in the Alt mode have not been assigned yet and can be utilized as required. Some of these could also be designated as dynamic or software/user definable.

Custom Modes

As an extension and addition to the predefined modes, one or more custom modes can be supported. These may be software definable, and would be entered by one of the user definable Alt codes.

Character Map

Table 1 represents a character map, which shows all the characters and control codes generated in the different operating modes.

The first line indicates the mode for the corresponding column.

The first two columns define the keystroke:

column 1 uses a number notation, the two numbers are the key numbers of the two keys in the order they are pressed column 2 uses a 'graphical' notation, each keystroke is represented as an arrow starting at the position of the first pressed key and pointing to the position of the second pressed key For the rolling composite keystrokes the two keys are released in the same order that they were pressed. For the rocking composite keystrokes the two keys are released in the reversed order.

TABLE 1

Character map showing all the generated characters and control codes.

| mode | | Normal | Control | Shift | Numeric | Language | Alternate |
|---|---|---|---|---|---|---|---|
| single keystrokes | | | | | | | |
| 1 | o... | <space> | {shift} | <lock> | <space> | <space> | Up |
| 2 | .o.. | a | {num} | A | <lock> | l.sp. | Left |
| 3 | ..o. | e | {lang} | E | = | l.sp. | Right |
| 4 | ...o | {ctrl} | {alt} | {ctrl} | {ctrl} | {ctrl} | Down |
| rolling keystrokes | | | | | | | |
| 1-2 | ->.. | l | TAB | L | 1 | l.sp. | TAB |
| 2-1 | <-.. | o | LF | O | 2 | l.sp. | LF |
| 1-3 | -->. | i | WordR | I | 3 | l.sp. | WordR |
| 3-1 | <--. | y | WordL | Y | 4 | l.sp. | WordL |
| 1-4 | ---> | w | End | W | 9 | l.sp. | End |
| 4-1 | <--- | u | Home | U | 0 | l.sp. | Home |
| 2-3 | .->. | h | DEL | H | 5 | l.sp. | DEL |
| 3-2 | .<-. | t | BACKSP | T | 6 | l.sp. | BACKSP |
| 2-4 | .--> | c | DelEol | C | 7 | l.sp. | DelEol |
| 4-2 | .<-- | d | DelWord | D | 8 | l.sp. | DelWord |
| 3-4 | ..-> | v | EOF | V | | l.sp. | EOF |
| 4-3 | ..<- | q | BOF | Q | @ | l.sp. | BOF |
| rocking keystrokes | | | | | | | |
| 1=2 | =>.. | n | : | N | * | l.sp. | {prev.} |
| 2=1 | <=.. | m | ; | M | + | l.sp. | NA |
| 1=3 | ==>. | p | ? | P | \ | l.sp. | NA |
| 3=1 | <==. | r | ! | R | / | l.sp. | NA |
| 1=4 | ===> | j | – | J | – | l.sp. | < |
| 4=1 | <=== | b | ' | B | % | l.sp. | > |
| 2=3 | .=>. | f | , | F | , | l.sp. | ~ |
| 3=2 | .<=. | s | . | T | . | l.sp. | ` |
| 2=4 | .==> | g | & | G | & | l.sp. | [ |
| 4=2 | .<== | k | " | K | \| | l.sp. | ] |
| 3=4 | ..=> | x | ( | X | # | l.sp. | { |
| 4=3 | ..<= | z | ) | Z | $ | l.sp. | } |

What is claimed is:

1. A method for input of characters to electronic devices with a keyboard having four keys (or four other binary sensors) operated by four fingers of one hand, one key per finger, by performing so called "composite keystrokes", comprising the steps of:

pressing one of the four keys pressing a second key before the first pressed key is released, and then either releasing the key that was pressed first (so called "rolling keystroke") or releasing the key that was pressed second (so called "rocking keystroke")

and finally releasing the remaining pressed key.

2. A method as described in claim 1, where the possible 24 composite keystrokes are used to generate most of the 26 characters of the English alphabet.

3. A method as described in claim 2, where at least two of the four possible simple keystrokes (where a single key is pressed and released before any other key is pressed) are used to generate the remaining characters of the English alphabet.

4. A method as described in claim 3, where one of the simple keystrokes, optionally followed by another simple keystroke of any of the four keys, is used to enter one of the five alternate modes, which are used to generate characters in a similar way as in claim 3, but instead of the lowercase English alphabet characters they generate uppercase, numeric, language specific and special characters and editing and cursor control codes.

5. A method as described in claim 4, where pressing at least three keys at the same time (before any of them is released) is interpreted as a "cancel" keystroke, resulting in no character being generated and the operating mode returning to the normal mode.

6. A method using the same code (key combination to character assignment) as in claim 3, however used for data output rather than input, such that the desired stream of characters to be output to the user is converted to a sequence of slight movements or brief vibrations of the four keys, these being sensed by the user (by the four fingers in contact with the four keys) and interpreted as a sequence of characters.

* * * * *